(12) United States Patent
Qiao et al.

(10) Patent No.: US 10,964,906 B2
(45) Date of Patent: Mar. 30, 2021

(54) ORGANIC LIGHT-EMITTING DISPLAY PANEL AND ORGANIC LIGHT-EMITTING DISPLAY APPARATUS

(71) Applicant: Shanghai Tianma AM-OLED Co., Ltd., Shanghai (CN)

(72) Inventors: Weili Qiao, Shanghai (CN); Jinghua Niu, Shanghai (CN); Xiaoqian Sun, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 6 days.

(21) Appl. No.: 16/244,227

(22) Filed: Jan. 10, 2019

(65) Prior Publication Data
US 2020/0044182 A1 Feb. 6, 2020

(30) Foreign Application Priority Data
Aug. 1, 2018 (CN) .......................... 201810862737.2

(51) Int. Cl.
*H01L 51/52* (2006.01)
*H01L 27/32* (2006.01)
*H01L 51/50* (2006.01)

(52) U.S. Cl.
CPC ...... *H01L 51/5221* (2013.01); *H01L 27/3244* (2013.01); *H01L 51/5004* (2013.01);
(Continued)

(58) Field of Classification Search
None
See application file for complete search history.

(56) References Cited

U.S. PATENT DOCUMENTS

| | | | |
|---|---|---|---|
| 6,486,601 B1 * | 11/2002 | Sakai | B82Y 20/00 313/504 |
| 2007/0228503 A1 * | 10/2007 | Yokoyama | H01L 27/14667 257/431 |

(Continued)

FOREIGN PATENT DOCUMENTS

| | | |
|---|---|---|
| CN | 1427654 A | 7/2003 |
| CN | 102172103 A | 8/2011 |
| CN | 202127043 U | 1/2012 |

OTHER PUBLICATIONS

Venla M. Manninen, Synthesis and characterization of tris-(5-amino-8-hydroxyquinoline) aluminum complexes and their use as anode buffer layers in inverted organic solar cells, 2012, J. Mater. Chem., 2012, 22, 22971 (Year: 2012).*

*Primary Examiner* — Charles D Garber
*Assistant Examiner* — Xiaoming Liu
(74) *Attorney, Agent, or Firm* — Miller, Matthias & Hull LLP

(57) ABSTRACT

Provided are an organic light-emitting display panel and an organic light-emitting display apparatus. The organic light-emitting display panel includes an array base substrate including a plurality of driving elements, and includes a plurality of organic light-emitting devices. Each of the plurality of organic light-emitting devices is corresponding to a respective one of the plurality of driving elements, and the each of the plurality of organic light-emitting devices includes an anode and a cathode, a cathode, an organic luminous layer, an electron transport layer, and a transition layer. The organic luminous layer is disposed between the anode and the cathode, the electron transport layer is disposed between the luminous layer and the cathode, and the transition layer is disposed between the cathode and the electron transport layer, and the transition layer includes an organic material.

16 Claims, 6 Drawing Sheets

(52) U.S. Cl.
CPC ...... *H01L 51/5072* (2013.01); *H01L 51/5092* (2013.01); *H01L 51/5262* (2013.01); *H01L 2251/552* (2013.01)

(56) References Cited

U.S. PATENT DOCUMENTS

| | | | | |
|---|---|---|---|---|
| 2008/0098957 | A1* | 5/2008 | Ryu | C23C 14/547 118/712 |
| 2008/0284321 | A1* | 11/2008 | Tanaka | H01L 51/5052 313/504 |
| 2009/0191427 | A1* | 7/2009 | Liao | H01L 51/5096 428/690 |
| 2012/0235197 | A1* | 9/2012 | Okuyama | H01L 51/5262 257/98 |
| 2014/0299854 | A1* | 10/2014 | Mizuno | H01L 51/5056 257/40 |
| 2015/0041771 | A1* | 2/2015 | Cho | H01L 51/56 257/40 |
| 2016/0225947 | A1* | 8/2016 | Murayama | H01L 33/06 |
| 2017/0229669 | A1* | 8/2017 | Rausch | H01L 51/504 |
| 2018/0366650 | A1* | 12/2018 | Yokoyama | C09K 11/06 |

* cited by examiner

ORGANIC LIGHT-EMITTING DISPLAY PANEL AND ORGANIC LIGHT-EMITTING DISPLAY APPARATUS

CROSS-REFERENCE TO RELATED APPLICATIONS

This application claims priority to Chinese patent application No. 201810862737.2 filed on Aug. 1, 2018, the disclosure of which is incorporated herein by reference in its entirety.

TECHNICAL FIELD

The present disclosure relates to display technologies, and in particular relates to an organic light-emitting display panel and an organic light-emitting display apparatus.

BACKGROUND

Organic light-emitting diode OLED display technology has the advantages of spontaneous light, wide viewing angle, almost infinite contrast, low power consumption and high reaction speed and the like. The OLED display technology is widely used in various display fields such as mobile phone, digital camera, personal digital assistant (PDA), laptop, car audio and television.

In related arts, the OLED includes a cathode, an electron transport layer, a luminous layer, a hole transport layer, an anode and a base substrate. When the OLED is in operation, a bias voltage is applied between the anode and the cathode, holes move from the hole transport layer to the luminous layer, and electrons move from the electron transport layer to the emitting material layer. On the luminous layer, electrons and holes combine to produce excitons. Excitons are unstable and release energy, the released energy is transferred to the molecules of organic light-emitting material in the luminous layer, causing the molecules of organic light-emitting material to transmit from the ground state to the excited state. The excited state is very unstable, the excited molecules return to the ground state from the excited state, and such radiative transition produces luminescence. In an OLED in related arts, when the cathode of the OLED is formed by co-evaporation of magnesium and silver, the thickness of the cathode is too thin, and the cathode is easy to form in an island shape. When the cathode of the OLED is formed by silver separately, it is easy to gather and form defects, and when the thickness of the cathode is greater than 20 nm (greater than 200 A), the light transmittance deteriorates, leading to lower OLED luminous efficiency.

SUMMARY

The present disclosure provides an organic light-emitting display panel and an organic light-emitting display apparatus so as to improve the light extraction rate and effectively improve the luminous efficiency.

In a first aspect, the present disclosure provides an organic light-emitting display panel, and the organic light-emitting display panel includes an array base substrate including a plurality of driving elements, and includes a plurality of organic light-emitting devices. Each of the plurality of organic light-emitting devices is corresponding to a respective one of the plurality of driving elements, and the each of the plurality of organic light-emitting devices includes an anode, a cathode, an organic luminous layer, an electron transport layer and a transition layer.

The organic luminous layer is disposed between the anode and the cathode. The electron transport layer is disposed between the luminous layer and the cathode. The transition layer is disposed between the cathode and the electron transport layer, and the transition layer includes organic material.

A refractive index n1 of the transition layer for visible light with a wavelength of 500 nm and a refractive index n2 of the electron transport layer for the visible light with the wavelength of 500 nm satisfy that $0.05 \leq n1-n2 \leq 0.4$.

A lowest unoccupied orbital energy level LUMO1 of the transition layer and a work function $\varphi 1$ of the cathode satisfy that $0 \text{ eV} \leq |\text{LUMO1}-\varphi 1| \leq 2.6 \text{ eV}$.

A lowest unoccupied orbital energy level LUMO2 of the electron transport layer and the lowest unoccupied orbital energy level LUMO1 of the transition layer satisfy that $0.4 \text{ eV} \leq |\text{LUMO1}-\text{LUMO2}| \leq 1 \text{ eV}$.

In a second aspect, the present disclosure further provides an organic light-emitting display apparatus, and the organic light-emitting display apparatus includes any organic light-emitting display panel provided in embodiments of the present disclosure.

The organic light-emitting display panel provided in embodiments of the present disclosure includes an array base substrate including a plurality of driving elements, and includes plurality of organic light-emitting devices. Each of the plurality of organic light-emitting devices is corresponding to a respective one of the plurality of driving elements, and the each of the plurality of organic light-emitting devices includes an anode, a cathode, an organic luminous layer, an electron transport layer, and a transition layer. The luminous layer is disposed between the anode and the cathode. The electron transport layer is disposed between the organic luminous layer and the cathode. The transition layer is disposed between the cathode and the electron transport layer, and the transition layer includes organic material. The embodiments of the present disclosure provides an arrangement that a refractive index n1 of the transition layer for visible light with the wavelength of 500 nm and a refractive index n2 of the electron transport layer for the visible light with the wavelength of 500 nm satisfy that $0.05 \leq n1-n2 \leq 0.4$, that is the refractive index of the transition layer is greater than the refractive index of the electron transport layer. Such arrangement can avoid full reflection of light emitted by the organic luminous layer when the light passes through the interface between the electron transport layer and the transition layer, improving the extraction rate of light. The embodiments of the present disclosure provide an arrangement that a lowest unoccupied orbital energy level LUMO1 of the transition layer and a work function $\varphi 1$ of the cathode satisfy that $0 \text{ eV} \leq |\text{LUMO1}-\varphi 1| \leq 2.6 \text{ eV}$, which can facilitate migration of electron carriers. The embodiments of present disclosure provided an arrangement that a lowest unoccupied orbital energy level LUMO2 of the electron transport layer and the lowest unoccupied orbital energy level LUMO1 of the transition layer satisfy that $0.4 \text{ eV} \leq |\text{LUMO1}-\text{LUMO2}| \leq 1 \text{ eV}$, and a difference of lowest energy level between the electron transport layer and the transition layer is small, which can reduce electron injection potential barrier and facilitate more electrons to be injected into the organic luminous layer, so as to improve the light extraction rate of organic light-emitting devices, effectively improve the luminous efficiency and improve the performance of the organic light-emitting display panel.

DETAILED DESCRIPTION

Figure 1:
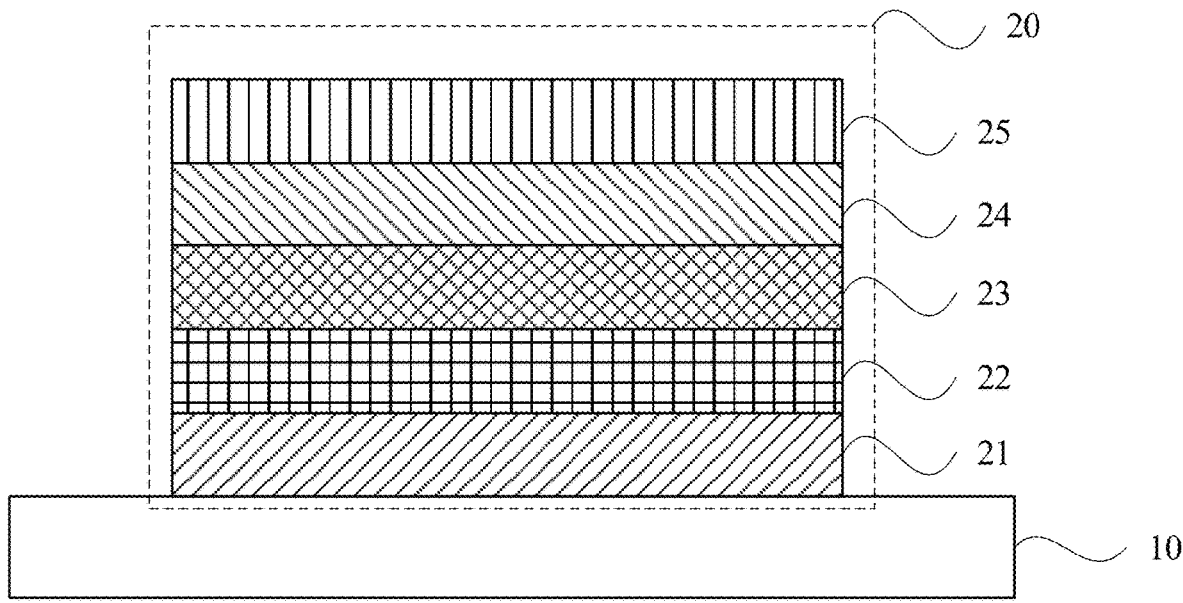
FIG. 1 is a structure diagram of an organic light-emitting display panel according to an embodiment of the present disclosure.

The present disclosure is further detailed below in combination with the drawings and embodiments. It should be understood that, the specific embodiments described herein are merely used to explain the present disclosure rather than limiting the present disclosure. In addition, it should be stated that in order to facilitate the description, merely a part of structure related to the present disclosure rather than the whole structure are illustrated in the drawings.

Terms used in embodiments of the present disclosure are only for the purpose to describe a specific example, rather than to limit the present disclosure. It should be noted that locative words in embodiments of the present disclosure such as "up" and "down", "left" and "right" and other words are described from the view of drawings, rather than to limit the present disclosure. In context, it also needs to understand that when it comes to a component that is formed "above" or "below" another element, it can not only form directly "above" or "below" another element, but also form indirectly "above" or "below" another element through an intermediate component. The terms "first", "second", and the like are only used to describe, and does not mean any sequence, quantity or importance, only to distinguish different components. For those skilled in the art, the specific meaning of the above mentioned terms in the present disclosure can be understood in specific cases.

FIG. 1 is a structure diagram of an organic light-emitting display panel according to an embodiment of the present disclosure. As shown in FIG. 1, the organic light-emitting display panel includes an array base substrate 10, and the array base substrate 10 includes a plurality of driving elements (not shown in drawings). The organic light-emitting display panel further includes a plurality of organic light-emitting devices 20, each light-emitting device 20 is corresponding to a respective one of the plurality of driving elements, and the each light-emitting device 20 includes an anode 21, a cathode 25, an organic luminous layer 22, an electron transport layer 23, and a transition layer 24. The organic luminous layer 22 is disposed between the anode 21 and the cathode 25. The electron transport layer 23 is disposed between the organic luminous layer 22 and the cathode 25. The transition layer 24 is disposed between the cathode 25 and the electron transport layer 23, and the transition layer 24 includes an organic material. A refractive index n1 of the transition layer 24 for the visible light with a wavelength of 500 nm and a refractive index n2 of the electron transport layer 23 for the visible light with the wavelength of 500 nm satisfy that $0.05 \leq n1-n2 \leq 0.4$. A lowest unoccupied orbital energy level LUMO1 of the transition layer 24 and a work function $\varphi1$ of the cathode 25 satisfy that $0 \text{ eV} \leq |LUMO1-\varphi1| \leq 2.6 \text{ Ev}$. A lowest unoccupied orbital energy level LUMO2 of the electron transport layer 23 and the lowest unoccupied orbital energy level LUMO1 of the transition layer 24 satisfy that $0.4 \text{ eV} \leq |LUMO1-LUMO2| \leq 1 \text{ eV}$.

It is to be understood that the array base substrate 10 may be a flexible base substrate, and the organic light-emitting display panel may be a flexible organic light-emitting display panel, which has low power consumption and flexible performance. The flexible organic light-emitting display panel is suitable for various display apparatuses, especially for wearable display apparatuses. In one or more embodiments, the flexible substrate is made of polyesterimide or polyethylene terephthalate resin. In addition, the array base substrate 10 may be a rigid substrate, and the organic light-emitting display panel is a rigid organic light-emitting display panel. The present disclosure does not specify the material of the organic light-emitting display panel.

In the organic light-emitting display panel provided in the present disclosure, the anode 21 of the each of the plurality of organic light-emitting devices 20 is in contact with a side surface of the array substrate 10. The organic luminous layer 22, the electron transport layer 23, the transition layer 24 and the cathode 25 are stacked successively on the anode 21. In the light-emitting process of the plurality of organic light-emitting devices 20, the driving element applies positive voltage to the anode 21. The material of the anode 21 may be indium tin oxide (ITO). In one or more embodiments, the anode 21 includes a reflective film, and the reflective film may be disposed on a side surface of the anode 21 facing away from the array base substrate 10, and a material of the reflective film may be Ag. The anode 21 may further includes a transparent conductive film on a side surface of the reflective film facing away from the array base substrate 10, and a material of the transparent conductive film may be ITO or indium zinc oxide (IZO).

In the light-emitting process of the plurality of organic light-emitting devices 20, the driving element applies a negative voltage to the cathode 25. In order to improve the injection capacity of electron carriers, the cathode 25 may be formed by using a metal material with a low work function, such as Ag, Al, Ca, In, Li, Mg and the like, or composite metal materials with a low work function.

In related arts, in the manufacturing process of the cathode 25 of the organic light-emitting devices 20, the cathode 25 may form defects, affecting light transmittance and resulting in deterioration of luminescence performance. For example, when the cathode is formed by co-evaporation of magnesium and silver the thickness of the cathode is too thin, and easy to form in an island shape; and when the cathode is formed by silver separately, it is easy to gather and form defects, and when the thickness of the cathode is greater than 20 nm (greater than 200 A), the light transmittance deteriorates.

Figure 2:
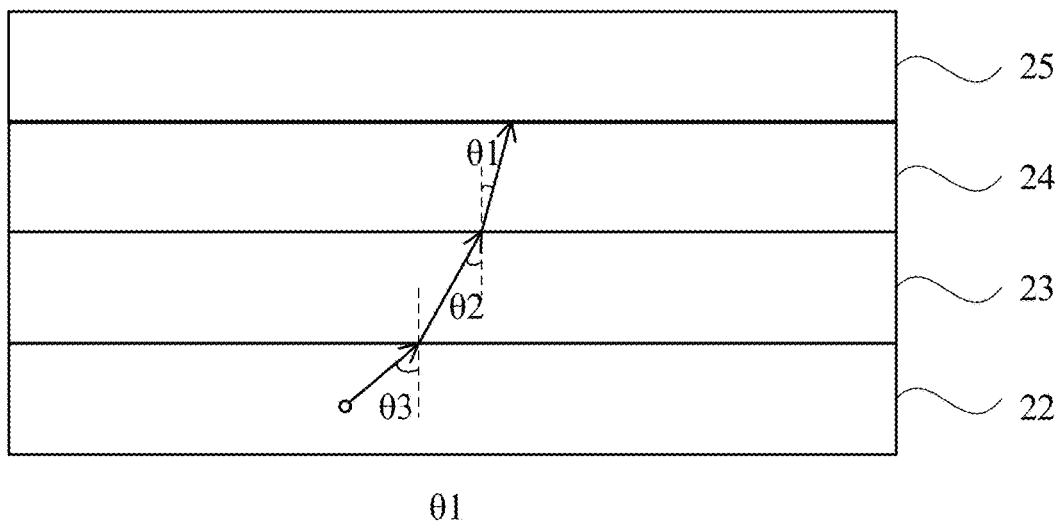
FIG. 2 is a diagram showing light transport route between an organic luminous layer and a cathode according to an embodiment of the present disclosure.

FIG. 2 is a diagram showing light transport route between an organic luminous layer and a cathode according to an embodiment of the present disclosure. As shown in FIG. 2, light emitted by the organic luminous layer 22 arrives at the transition layer 24 through the electron transport layer 23. As the refractive index n1 of the transition layer 24 is greater than the refractive index n2 of the electron transport layer 23, according to Snell's Law (law of refraction): $n1/n2=\sin\theta2/\sin\theta1$, it is obtained that $\theta1<\theta2$, and light at the interface between the electron transport layer 23 and the transition layer 24 is extracted on the light outgoing side, increasing the light extraction rate. In one or more exemplary embodiments, the refractive index n2 of the electron transport layer 23 is arranged to be greater than the refractive index n3 of the organic luminous layer 22, according to the law of refraction, it is obtained that in FIG. 2 $\theta2<\theta3$, and light at the interface between the organic luminous layer 22 and the electron transport layer 23 is extracted again on the light outgoing side, increasing the light extraction rate. In this embodiment, the refractive index n1 of the transition layer 24 for the visible light with the wavelength of 500 nm satisfies that $1.8 \leq n1 \leq 2.2$. An optical absorption coefficient A of the transition layer 24 for the visible light with a wavelength of 500 nm satisfies that $A \leq 0.5\%$. Through an arrangement that the optical absorption coefficient A of the transition layer 24 for the visible light with the wavelength of 500 nm satisfies that $A \leq 0.5\%$, it can guarantee that the organic light-emitting device 20 has sufficient light emission efficiency.

In this embodiment, the lowest unoccupied orbital energy level LUMO1 of the transition layer 24 and a work function $\varphi1$ of the cathode 25 satisfy that $0 \text{ eV} \leq |\text{LUMO1}-\varphi1| \leq 2.6$ eV. The lowest unoccupied orbital energy level LUMO2 of the electron transport layer 23 and the lowest unoccupied orbital energy level LUMO1 of the transition layer 24 satisfy that $0.4 \text{ eV} \leq |\text{LUMO1}-\text{LUMO2}| \leq 1$ eV. Through energy level matching between the lowest unoccupied orbital energy levels of the electron transport layer 23 and the lowest unoccupied energy level of the transition layer 24 and the work function of the cathode 25, it is conducive to the migration of electron carriers, reducing the injection potential barrier of electrons, and facilitating the injection of more electrons to the organic luminous layer 22.

It is to be understood that electrons carry with negative electricity and the migration of electrons is from a low energy level to a high energy level. It is more conducive to the migration of electron and to improve the performance of organic light-emitting devices by setting $0 \text{ eV} \leq |\text{LUMO1}-|\varphi1|| \leq 2.6$ eV, $0.4 \text{ eV} \leq |\text{LUMO1}-\text{LUMO2}| \leq 1$ eV.

The organic light-emitting display panel provided in the present disclosure, through the arrangement that the refractive index of the transition layer is greater than the refractive index of the electron transport layer, can avoid the total reflection of light emitted by the organic light-emitting layer when the light passes through the interface between the electron transport layer and the transition layer. The organic light-emitting display panel provided in the present disclosure, through further arranging the relationship of the work function of the cathode, the lowest unoccupied orbital energy level of the transition layer and the lowest unoccupied orbital energy level of the electron transport layer, can reduce the electronic injection barrier, facilitate more electronics to be injected to the organic luminous layer, so as to increase the light extraction rate of organic light-emitting devices, effectively improve the luminous efficiency and improve the performance of organic light-emitting display panel.

In one or more embodiments, the lowest unoccupied orbital energy level LUMO1 of the transition layer and the work function $\varphi1$ of the cathode satisfy that $1.0 \text{ eV} \leq |\text{LUMO1}-\varphi1| \leq 2.0$ eV. The lowest unoccupied orbital energy level LUMO2 of the electron transport layer and the lowest unoccupied orbital energy level LUMO1 of the transition layer satisfy that $0.5 \text{ eV} \leq |\text{LUMO1}-\text{LUMO2}| \leq 0.7$ eV.

Applicants have found that, through an arrangement where the lowest unoccupied orbital energy level LUMO1 of the transition layer and the work function $\phi1$ of the cathode satisfy that $1.0 \text{ eV} \leq |\text{LUMO1}-\phi1| \leq 2.0$ eV and the lowest unoccupied orbital energy level LUMO2 of the electron transport layer and the lowest unoccupied orbital energy level LUMO1 of the transition layer satisfy that $0.5 \text{ eV} \leq |\text{LUMO1}-\text{LUMO2}| \leq 0.7$ eV, the efficiency of electron injection and the performance of organic light-emitting device can be further improved.

In one or more embodiments, a highest occupied orbital energy level HOMO1 of the transition layer satisfies that $5.8 \text{ eV} \leq |\text{HOMO1}| \leq 6.4$ eV. The lowest unoccupied orbital energy level LUMO1 of the transition layer satisfies that $2.2 \text{ eV} \leq |\text{LUMO1}| \leq 2.8$ eV.

Taking an arrangement where the highest occupied orbital energy level HOMO1 of the transition layer satisfies that $5.8 \text{ eV} \leq |\text{HOMO1}| \leq 6.4$ eV and the lowest unoccupied orbital energy level LUMO1 of the transition layer satisfies that $2.2 \text{ eV} \leq |\text{LUMO1}| \leq 2.8$ eV, it is able to match reasonable energy level differences among the transition layer, the cathode and electron transport layer, and electron injection efficiency is improved.

Further referring to FIG. 1, in one or more embodiments, the transition layer 24 is disposed adjacent to the cathode 25, and the transition layer 24 is configured to improve morphology of a surface of the cathode 25 adjacent to the transition layer 24. In one or more embodiments, a roughness of the surface of the cathode 25 adjacent to the transition layer 24 is less than the roughness of a surface of the cathode 25 facing away from the transition layer 24.

It is to be understood that the transition layer 24 may shorten a dispersion length of the interface between the cathode 25 metal and the transition layer 24, improve the morphology and uniformity of the surface of the cathode 25, reduce the optical waveguide effect and the contribution of the plasma on the surface of the cathode 25, so as to increase light transmittance performance of the cathode 25.

Figure 3:
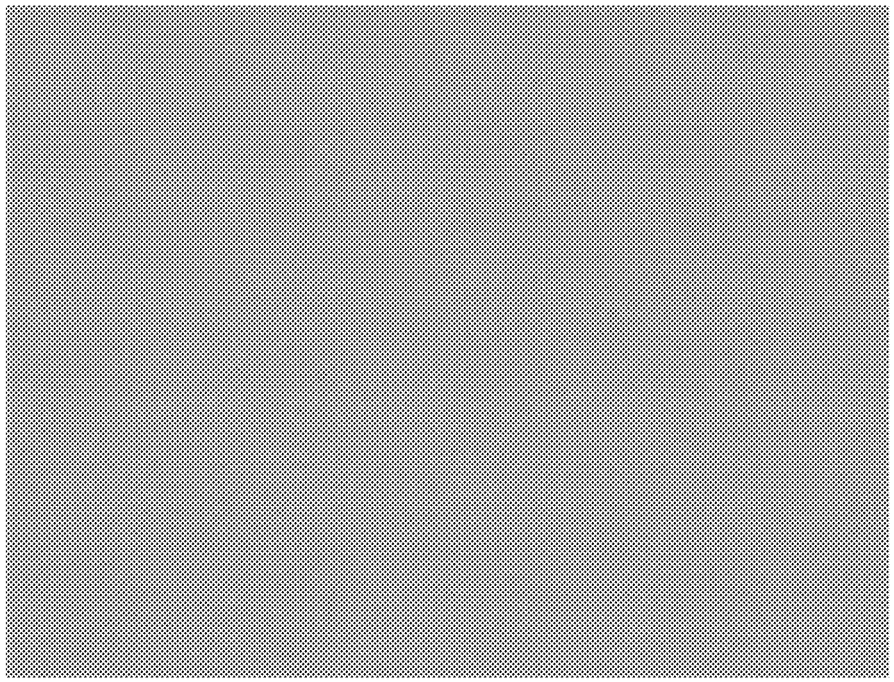
FIG. 3 is a morphology micrograph of a cathode of an organic light-emitting device according to an embodiment of the present disclosure.
Figure 4:
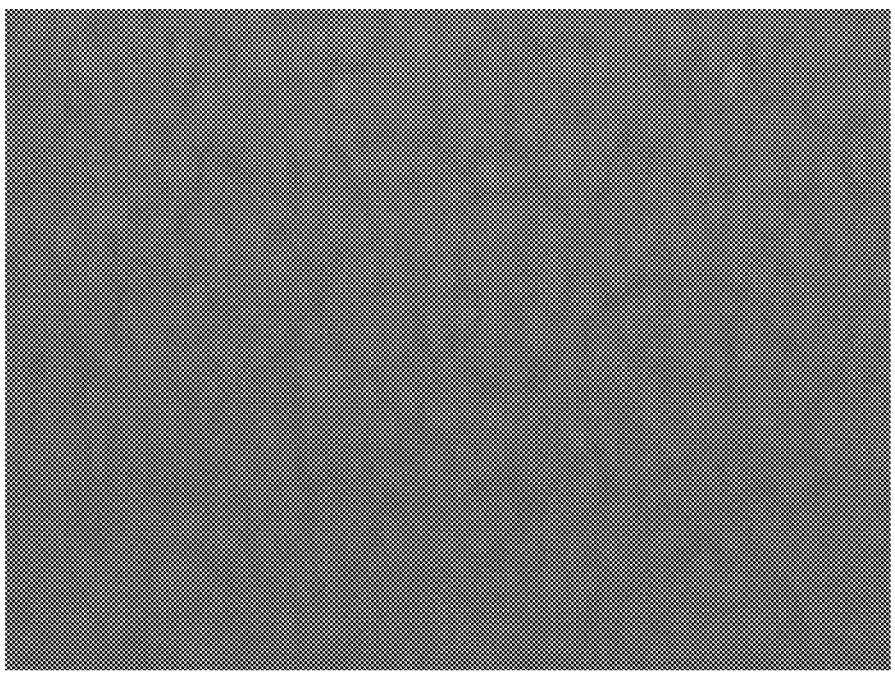
FIG. 4 is a morphology micrograph of a cathode of an organic light-emitting device according to a comparison embodiment of the present disclosure.
Figure 5:
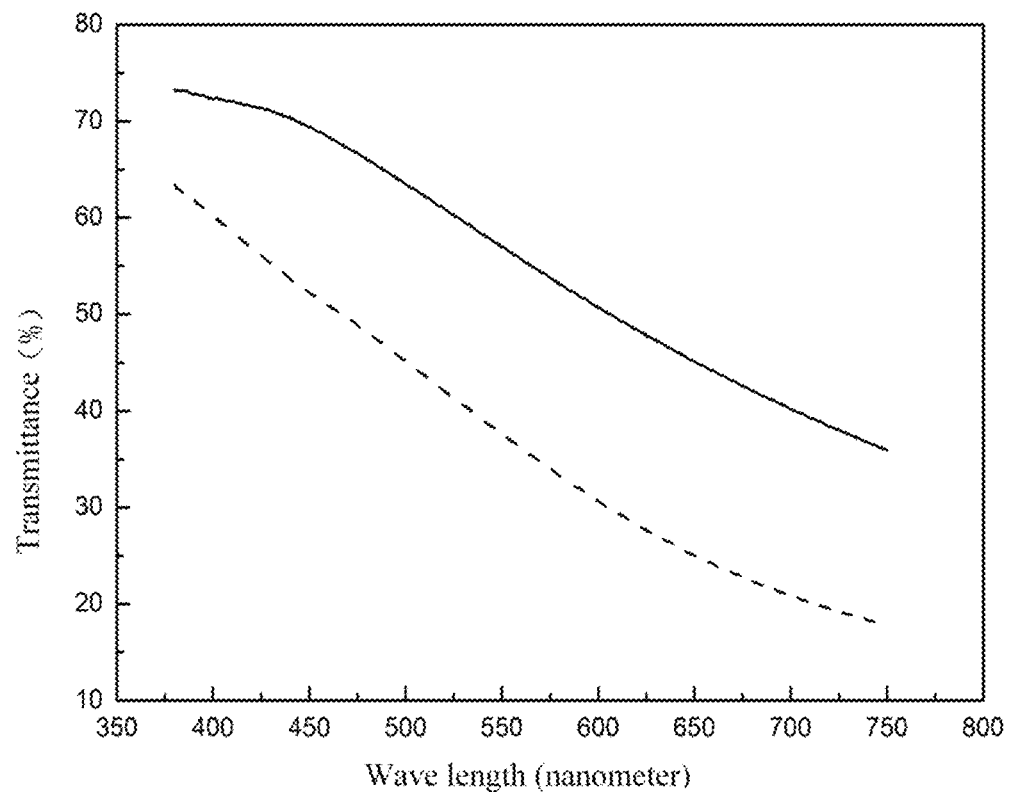
FIG. 5 is a comparison diagram showing light transmittance of an organic light-emitting device according to a comparison embodiment and an embodiment of the present disclosure.

An image of the morphology of the surface of the cathode may be obtained by microscopic imaging the cathode by a scanning electron microscope. FIG. 3 is a morphology micrograph of a cathode of an organic light-emitting device according to an embodiment of the present disclosure, FIG. 4 is a morphology micrograph of a cathode of an organic light-emitting device according to a comparison embodiment of the present disclosure, and the organic light-emitting device in the comparison embodiment does not include the transition layer. With a comparison of FIG. 3 and FIG. 4, the transition layer can improve the morphology of the surface of the cathode. FIG. 5 is a comparison diagram showing light transmittance of an organic light-emitting device according to a comparison embodiment and an embodiment of the present disclosure, the solid line is a light transmittance curve of the cathode of the organic light-emitting device provided in this embodiment, and the dash line is a light transmittance curve of the cathode of the organic light-emitting device provided in the comparison embodiment. As shown in FIG. 5, the transition layer helps to increase light transmittance performance of the cathode and improve the performance of organic light-emitting device.

In one or more embodiment, the transition layer includes at least one of: a quinoline group, an oxazole group and a dinitrogen anthracene group.

The transition layer may be an organic compound including the quinoline group, the oxazole group or the dinitrogen anthracene group, the transition layer may be an organic matter, or a mixture of multiple organic matters, this embodiment does not intent to limit the transition layer. The organic compound including the quinoline group, the oxazole group or the dinitrogen anthracene group has a strong affinity with the metal forming the cathode, which can effectively shorten the dispersion length in a film forming process of the cathode metal, increase the light transmittance performance of the cathode and improve the performance of organic light-emitting device.

In one or more embodiment, a thickness d of the transition layer satisfies that d≤30 nm.

It is to be understood that if the transition layer is too thick, it may influence the performance of device. If the thickness of the transition layer is set to be less than or equal to 30 nm, good luminous performance can be obtained. Under the condition that the cathode has the same light transmittance, the thickness of the cathode may be increased from 10 nm~14 nm to 14 nm~19 nm, effectively reducing the cathode resistance and power consumption.

Figure 6:
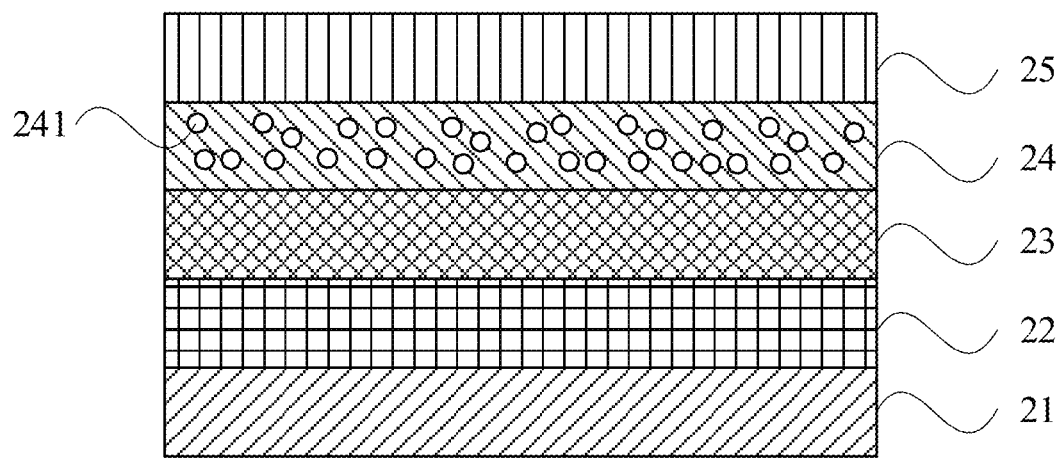
FIG. 6 is a structure diagram of an organic light-emitting device according to an embodiment of the present disclosure.

FIG. 6 is a structure diagram of an organic light-emitting device according to an embodiment of the present disclosure. As shown in FIG. 6, in one or more embodiments, the transition layer 24 includes a first dopant 241, and a work function φ2 of the first dopant 241 is less than the work function φ1 of the cathode 25. In one or more embodiments, the first dopant 241 includes an alkaline earth metal element or a rare earth metal element.

It is to be understood that after doping elementary substances of some rare earth metals or alkaline earth metals, or compounds of some rare earth metals or alkaline earth metals, into the transition layer 24, the interface resistance between the cathode 25 and the transition layer 24 may be reduced, so as to improve the ability of the cathode 25 to inject the electrons to the transition layer 24, and improve the response speed and luminescence efficiency of the organic light-emitting device. In this embodiment, the work function φ2 of the first dopant 241 is less than the work function φ1 of the cathode 25. This arrangement may further improve the ability of the cathode 25 to inject the electrons to the transition layer 24. Exemplarily, the first dopant 241 may be at least one of: Mg, Ga, Yb, Sm, Y, Tm, Gd and Lu.

Figure 7:
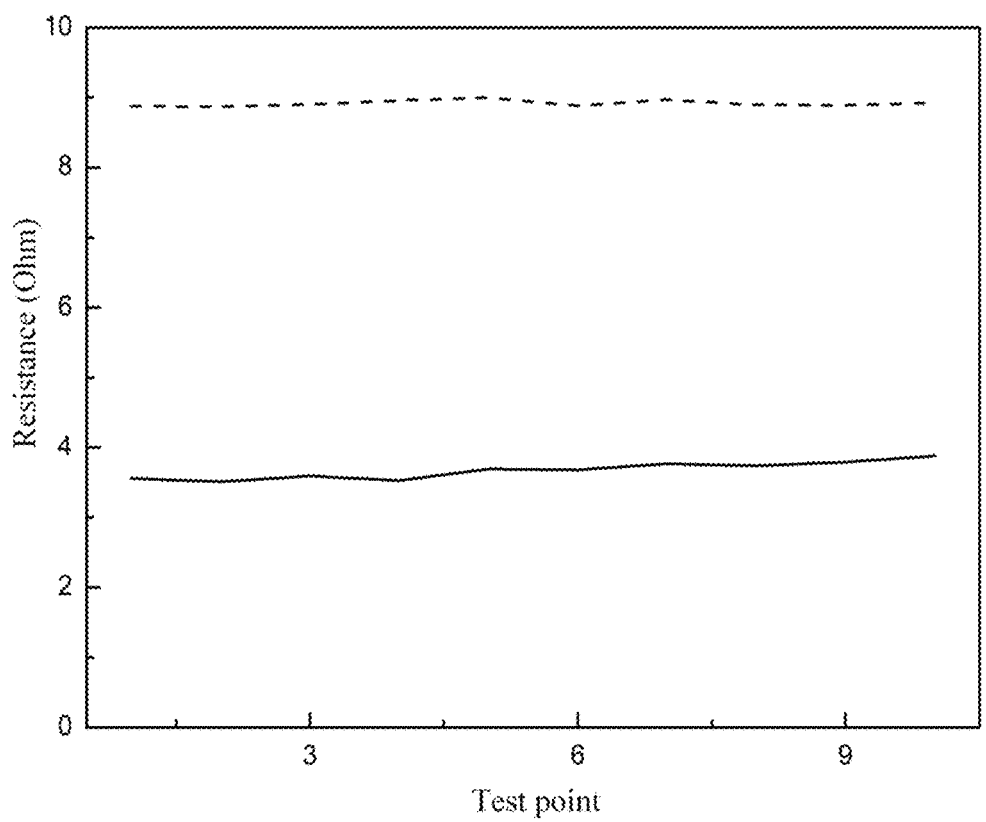
FIG. 7 is a comparison diagram showing a cathode sheet resistance of an organic light-emitting device according to a comparison embodiment and an embodiment of the present disclosure.

FIG. 7 is a comparison diagram showing a cathode sheet resistance of an organic light-emitting device according to an embodiment and a comparison embodiment of the present disclosure. The solid line is a cathode sheet resistance curve at different point of the organic light-emitting device in this embodiment, and the dash line is a cathode sheet resistance curve at different point of the organic light-emitting device in the comparison embodiment. As shown in FIG. 7, the organic light-emitting device provided in this embodiment can significantly reduce the cathode sheet resistance and improve the performance of the organic light-emitting device.

Figure 8:
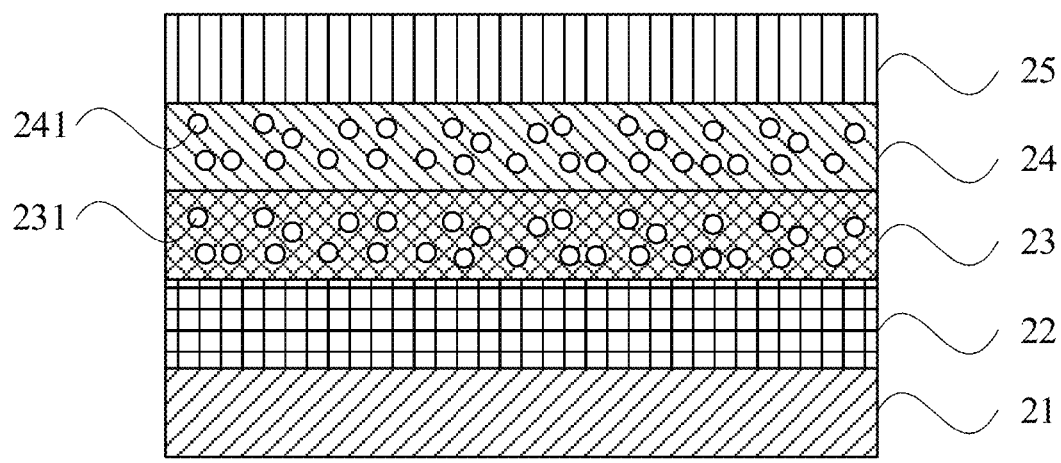
FIG. 8 is a structure diagram of an organic light-emitting device according to an embodiment of the present disclosure.

FIG. 8 is a structure diagram of an organic light-emitting device according to an embodiment of the present disclosure. As shown in FIG. 8, in one or more exemplary embodiments, the electron transport layer 23 includes a second dopant 231, and a work function φ3 of the second dopant 231 is less than or equal to the work function φ2 of the first dopant 241. In one or more exemplary embodiments, the second dopant 231 includes an alkaline earth metal element or a rare earth metal element.

Exemplarily, the second dopant 231 may be at least one of: Mg, Ga, Yb, Sm, Y, Tm, Gd and Lu, and the second dopant 231 may improve the electron transport capacity of the electron transport layer 23 and the performance of the organic light-emitting device.

It is understandable that the first dopant 241 and the second dopant 231 may use the same element or different elements. When the first dopant 241 and the second dopant 231 use the same element, the same process may be used in implementation, which is conducive to reduce cost.

Figure 9:
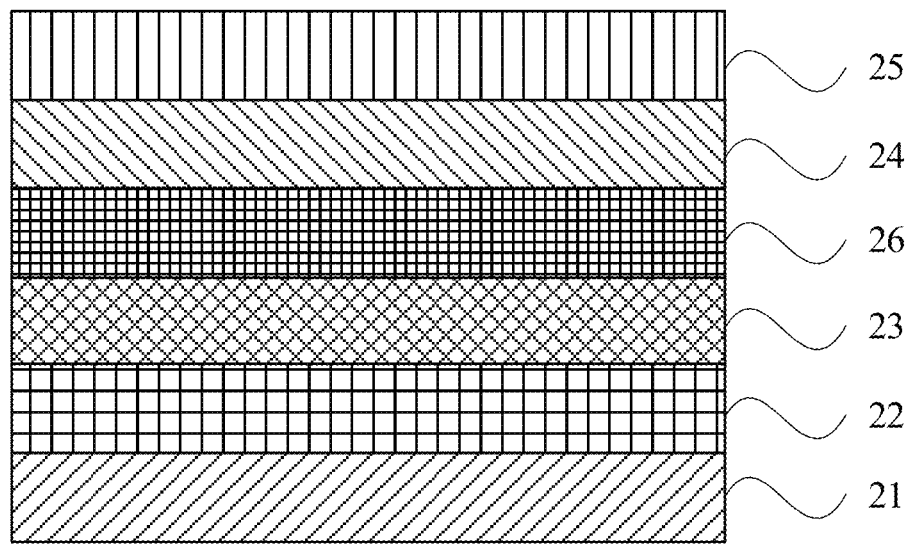
FIG. 9 is a structure diagram of another organic light-emitting device according to an embodiment of the present disclosure.

FIG. 9 is a structure diagram of another organic light-emitting device according to an embodiment of the present disclosure. As shown in FIG. 9, in one or more exemplary embodiments, an electron injection layer 26 is further disposed between the cathode 25 and the electron transport layer 23. In one or more exemplary embodiments, the electron injection layer 26 is disposed between the electron transport layer 23 and the transition layer 24, and a lowest unoccupied orbital energy level LUMO3 of the electron injection layer 26, the lowest unoccupied orbital energy level LUMO1 of the transition layer 24 and the lowest unoccupied orbital energy level LUMO2 of the electron transport layer 23 satisfy that |LUMO2|≤|LUMO3|≤|LUMO1|.

Through disposing the electron injection layer 26 and setting an energy level of the electron injection layer 26, the electron injection efficiency of the device and luminescence performance of the device are further improved.

Figure 10:
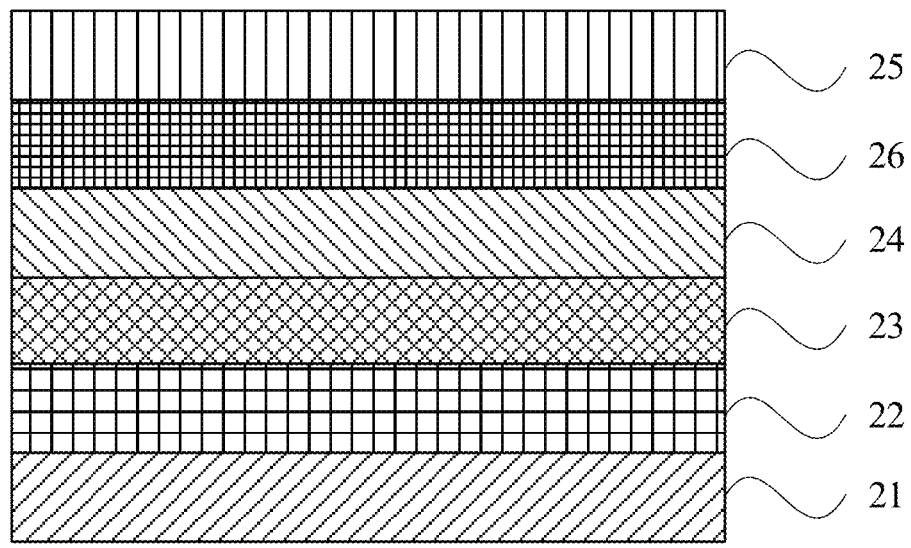
FIG. 10 is a structure diagram of another organic light-emitting device according to an embodiment of the present disclosure.

FIG. 10 is a structure diagram of another organic light-emitting device according to an embodiment of the present disclosure. As shown in FIG. 10, in one or more exemplary embodiments, the electron injection layer 26 is disposed between the transition layer 24 and the cathode 25, and the electron injection layer 26 includes at least one of: a rare earth metal and an alkaline earth metal.

Exemplarily, the electron injection layer 26 may be formed by using elements such as Yb and Sm to form a thin layer, which is disposed between the cathode 25 and the transition layer 24 to improve the electronic injection efficiency of the device.

Figure 11:
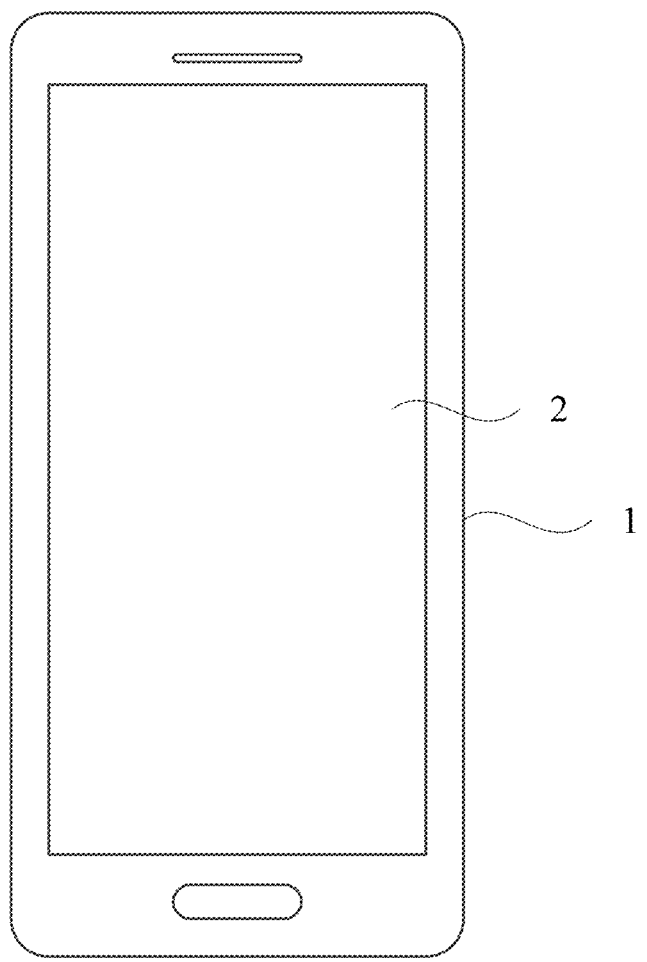
FIG. 11 is structure diagram of a display apparatus according to an embodiment of the present disclosure.

FIG. 11 is a structure diagram of an organic light-emitting display device according to an embodiment of the present disclosure. As shown in FIG. 11, the organic light-emitting display apparatus 1 includes any organic light-emitting display panel 2 provided in embodiments of the present disclosure. The organic light-emitting display apparatus 1 may be a mobile phone, a computer, a smart wearable device, and the like.

The organic light-emitting display apparatus provided in embodiments of the present disclosure, including the organic light-emitting display panel described above, realizes all the beneficial effects of the organic light-emitting display panel described above. That is, the embodiments of present disclosure provides an arrangement where an refractive index n1 of the transition layer of the organic light-emitting device for the visible light with the wavelength of 500 nm and a refractive index n2 of the electron transport layer of the organic light-emitting device for the visible light with the wavelength of 500 nm satisfy that 0.05≤n1−n2≤0.4, namely, the refractive index of the transition layer is greater than the refractive index of the electron transport layer. Such arrangement can avoid full reflection of light emitted by the organic luminous layer when the light passes through the interface between the electron transport layer and the transition layer, improving the extraction rate of light. The embodiments of the present disclosure provide an arrangement where a lowest unoccupied orbital energy level LUMO1 of the transition layer and a work function $\varphi1$ of the cathode satisfy that $0\ eV \leq |LUMO1-\varphi1| \leq 2.6\ eV$, which can facilitate migration of electron carriers. The embodiments of the present disclosure provide an arrangement where a lowest unoccupied orbital energy level LUMO2 of the electron transport layer and the lowest unoccupied orbital energy level LUMO1 of the transition layer satisfy that $0.4\ eV \leq |LUMO1-LUMO2| \leq eV$, and a difference of lowest energy level between the electron transport layer and the transition layer is small, which can reduce electron injection potential barrier and facilitate more electrons to be injected into the organic luminous layer, so as to improve the light extraction rate of organic light-emitting devices, effectively improve the luminous efficiency and improve the performance of the organic light-emitting display panel.

It should be noted that the above contents are only optional embodiments of the present disclosure and its technical principles. It can be understood for those skilled in the art that the present disclosure is not limited to specific embodiments described herein. For those skilled in the art, the present disclosure can be subject to various apparent variations, readjustments and replacements without departing from a protection scope of the present disclosure. Therefore, although the present disclosure is described in detail through above embodiments, the present disclosure is not only limited to above embodiments. The present disclosure can also include more other equivalent embodiments without deviating from conceptions of the present disclosure. A scope of the present disclosure is determined by a scope of attached claims.

What is claimed is:

1. An organic light-emitting display panel, comprising:
   an array base substrate, wherein the array base substrate comprises a plurality of driving elements; and
   a plurality of organic light-emitting devices, wherein each of the plurality of organic light-emitting devices is corresponding to a respective one of the plurality of driving elements, the each of the plurality of organic light-emitting devices comprises an anode, a cathode, an organic luminous layer, an electron transport layer, an electron injection layer and a transition layer, wherein,
   the organic luminous layer is disposed between the anode and the cathode;
   the electron transport layer is disposed between the organic luminous layer and the cathode;
   the transition layer is disposed between the cathode and the electron transport layer, the transition layer is disposed adjacent to the cathode, the transition layer is configured to improve morphology of a surface of the cathode adjacent to the transition layer, wherein a roughness of the surface of the cathode adjacent to the transition layer is less than a roughness of a surface of the cathode facing away from the transition layer, and the transition layer comprises an organic material;
   the electron injection layer is disposed between the transition layer and the electron transport layer;
   an refractive index n1 of the transition layer for visible light with a wavelength of 500 nm and an refractive index n2 of the electron transport layer for the visible light with a wavelength of 500 nm satisfy that $0.05 \leq n1-n2 \leq 0.4$;
   a lowest unoccupied orbital energy level LUMO1 of the transition layer and a work function $\varphi1$ of the cathode satisfy that $0\ eV \leq |LUMO1-\varphi1| \leq 2.6\ eV$; and
   a lowest unoccupied orbital energy level LUMO2 of the electron transport layer and the lowest unoccupied orbital energy level LUMO1 of the transition layer satisfy that $0.4\ eV \leq |LUMO1-LUMO2| \leq 1\ eV$.

2. The organic light-emitting display panel according to claim 1, wherein the lowest unoccupied orbital energy level LUMO1 of the transition layer and the work function $\varphi1$ of the cathode satisfy that $1.0\ eV \leq |LUMO1-\varphi1| \leq 2.0\ eV$; and
   the lowest unoccupied orbital energy level LUMO2 of the electron transport layer and the lowest unoccupied orbital energy level LUMO1 of the transition layer satisfy that $0.5\ eV \leq |LUMO1-LUMO2| \leq 0.7\ eV$.

3. The organic light-emitting display panel according to claim 1, wherein the transition layer comprises at least one of: a quinoline group, an oxazole group and a dinitrogen anthracene group.

4. The organic light-emitting display panel according to claim 1, wherein the refractive index n1 of the transition layer for the visible light with the wavelength of 500 nm satisfies that $1.8 \leq n1 \leq 2.2$.

5. The organic light-emitting display panel according to claim 1, wherein an optical absorption A of the transition layer for the visible light with the wavelength of 500 nm satisfies that $A \leq 0.005$.

6. The organic light-emitting display panel according to claim 1, wherein a highest occupied orbital energy level HOMO of the transition layer satisfies that $5.8\ eV \leq |HOMO1| \leq 6.4\ eV$; and
   the lowest unoccupied orbital energy level LUMO1 of the transition layer satisfies that $2.2\ eV \leq |LUMO1| \leq 2.8\ eV$.

7. The organic light-emitting display panel according to claim 1, wherein a thickness d of the transition layer satisfies that $d \leq 30\ nm$.

8. The organic light-emitting display panel according to claim 1, wherein the transition layer comprises a first dopant, and a work function $\varphi2$ of the first dopant is less than the work function $\varphi1$ of the cathode.

9. The organic light-emitting display panel according to claim 8, wherein the first dopant comprises an alkaline earth metal element or a rare earth metal element.

10. The organic light-emitting display panel according to claim 8, wherein the electron transport layer comprises a second dopant, and a work function $\varphi3$ of the second dopant is less than or equal to the work function $\varphi2$ of the first dopant.

11. The organic light-emitting display panel according to claim 10, wherein the second dopant comprises an alkaline earth metal element or a rare earth metal element.

12. The organic light-emitting display panel according to claim 1, wherein the electron injection layer is disposed between the electron transport layer and the transition layer, and a lowest unoccupied orbital energy level LUMO3 of the electron injection layer, the lowest unoccupied orbital energy level LUMO1 of the transition layer and the lowest unoccupied orbital energy level LUMO2 of the electron transport layer satisfy that $|LUMO2| \leq |LUMO3| \leq |LUMO1|$.

13. The organic light-emitting display panel according to claim 1, wherein the electron injection layer is disposed between the transition layer and the cathode, and the electron injection layer comprises at least one of: a rare earth metal and an alkaline earth metal.

14. An organic light-emitting display apparatus, comprising a display panel, wherein the display panel comprises:

an array base substrate, wherein the array base substrate comprises a plurality of driving elements; and
a plurality of organic light-emitting devices, wherein each of the plurality of organic light-emitting devices is corresponding to a respective one of the plurality of driving elements, the each of the plurality of organic light-emitting devices comprises an anode, a cathode, an organic luminous layer, an electron transport layer, an electron injection layer and a transition layer, wherein,
the organic luminous layer is disposed between the anode and the cathode;
the electron transport layer is disposed between the organic luminous layer and the cathode;
the transition layer is disposed between the cathode and the electron transport layer, the transition layer is disposed adjacent to the cathode, the transition layer is configured to improve morphology of a surface of the cathode adjacent to the transition layer, wherein a roughness of the surface of the cathode adjacent to the transition layer is less than a roughness or a surface of the cathode facing away from the transition layer, and the transition layer comprises an organic material;
the electron injection layer is disposed between the transition layer and the electron transport layer;
an refractive index n1 of the transition layer for visible light with a wavelength of 500 nm and an refractive index n2 of the electron transport layer for the visible light with a wavelength of 500 nm satisfy that $0.05 \leq n1-n2 \leq 0.4$;
a lowest unoccupied orbital energy level LUMO1 of the transition layer and a work function $\varphi1$ of the cathode satisfy that $0\ eV \leq |LUMO1-\varphi1| \leq 2.6\ eV$; and
a lowest unoccupied orbital energy level LUMO2 of the electron transport layer and the lowest unoccupied orbital energy level LUMO1 of the transition layer satisfy that $0.4\ eV \leq |LUMO1-LUMO2| \leq 1\ eV$.

15. The organic light-emitting display apparatus according to claim 14, wherein a roughness of the surface of the cathode adjacent to the transition layer is less than a roughness of a surface of the cathode facing away from the transition layer.

16. The organic light-emitting display apparatus according to claim 14, wherein the lowest unoccupied orbital energy level LUMO1 of the transition layer and the work function $\varphi1$ of the cathode satisfy that $1.0\ eV \leq |LUMO1-\varphi1| \leq 2.0\ eV$; and
the lowest unoccupied orbital energy level LUMO2 of the electron transport layer and the lowest unoccupied orbital energy level LUMO1 of the transition layer satisfy that $0.5\ eV \leq |LUMO1-LUMO2| \leq 0.7\ eV$.

* * * * *